United States Patent
Tian et al.

(10) Patent No.: US 12,308,265 B2
(45) Date of Patent: May 20, 2025

(54) RF IMMUNE SENSOR PROBE FOR MONITORING A TEMPERATURE OF AN ELECTROSTATIC CHUCK OF A SUBSTRATE PROCESSING SYSTEM

(71) Applicant: LAM RESEARCH CORPORATION, Fremont, CA (US)

(72) Inventors: Siyuan Tian, Fremont, CA (US); Yuma Ohkura, Jr., San Mateo, CA (US); Changyou Jing, Livermore, CA (US); Matthew Claussen, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 601 days.

(21) Appl. No.: 17/614,930

(22) PCT Filed: May 29, 2020

(86) PCT No.: PCT/US2020/035041
§ 371 (c)(1),
(2) Date: Nov. 29, 2021

(87) PCT Pub. No.: WO2020/243377
PCT Pub. Date: Dec. 3, 2020

(65) Prior Publication Data
US 2022/0238360 A1    Jul. 28, 2022

Related U.S. Application Data

(60) Provisional application No. 62/854,476, filed on May 30, 2019.

(51) Int. Cl.
*H01L 21/67* (2006.01)
*G01K 1/08* (2021.01)
(Continued)

(52) U.S. Cl.
CPC .......... *H01L 21/67248* (2013.01); *G01K 1/08* (2013.01); *G01K 1/143* (2013.01);
(Continued)

(58) Field of Classification Search
CPC .... G01K 1/08; G01K 1/143; H01L 21/67248; H01J 2237/24585; H01J 2237/334
See application file for complete search history.

(56) References Cited

U.S. PATENT DOCUMENTS

| 7,651,269 B2 * | 1/2010 | Comendant | G01K 1/16 |
| | | | 374/161 |
| 2002/0135454 A1 * | 9/2002 | Ichida | G01K 7/18 |
| | | | 374/E7.021 |

(Continued)

FOREIGN PATENT DOCUMENTS

| CN | 107219018 A | * | 9/2017 | G01K 1/08 |
| CN | 107478345 A | * | 12/2017 | G01K 1/08 |

(Continued)

OTHER PUBLICATIONS

Office Action issued in Corresponding Taiwanese Patent App. No. 109118051 dated Apr. 2, 2024.
(Continued)

*Primary Examiner* — Mirellys Jagan (57) ABSTRACT

A sensor probe includes an elongated body defining an inner cavity having an inner diameter. A printed circuit board is configured to be fitted within the inner cavity. A first temperature-sensing integrated circuit mounted at a first end of the printed circuit board. A cap is mounted to a first end of the elongated body adjacent to the first temperature-sensing integrated circuit. A housing is configured to receive a second end of the elongated body, wherein the housing is configured to be mounted to a baseplate of a substrate support.

23 Claims, 8 Drawing Sheets

(51) Int. Cl.
    *G01K 1/143* (2021.01)
    *H01J 37/32* (2006.01)
    *H01L 21/683* (2006.01)

(52) U.S. Cl.
    CPC ...... *H01J 37/32091* (2013.01); *H01J 37/321* (2013.01); *H01J 37/32724* (2013.01); *H01J 37/32935* (2013.01); *H01L 21/6833* (2013.01); *H01J 2237/24585* (2013.01); *H01J 2237/334* (2013.01)

(56) References Cited

U.S. PATENT DOCUMENTS

| | | | |
|---|---|---|---|
| 2006/0042757 | A1 | 3/2006 | Kanno et al. |
| 2008/0317093 | A1 | 12/2008 | Mau et al. |
| 2009/0022205 | A1* | 1/2009 | Comendant ............. G01K 1/16 374/161 |
| 2009/0135884 | A1 | 5/2009 | Sisk et al. |
| 2013/0047736 | A1* | 2/2013 | Papadeas ............. G01L 19/147 73/714 |
| 2013/0083326 | A1* | 4/2013 | Clark ............. G01K 1/16 374/185 |
| 2015/0071327 | A1* | 3/2015 | Krampert ............. G01K 1/143 374/208 |

FOREIGN PATENT DOCUMENTS

| | | | | |
|---|---|---|---|---|
| EP | 2916119 | A1 | * 9/2015 | .......... A61M 13/003 |
| JP | H0945752 | A | 2/1997 | |
| JP | H10107134 | A | 4/1998 | |
| JP | 2002246159 | A | 8/2002 | |
| JP | 2007116098 | A | 5/2007 | |
| JP | 2007227444 | A | * 9/2007 | |
| JP | 201142002 | A | 3/2011 | |
| JP | 4706033 | B2 | 6/2011 | |
| JP | 2016510181 | A | 4/2016 | |
| JP | 2019505092 | A | 2/2019 | |
| KR | 1019980043531 | A | 9/1998 | |
| KR | 20160129298 | A | * 9/2016 | |
| TW | 201825704 | A | 7/2018 | |
| TW | 201907507 | A | 2/2019 | |

OTHER PUBLICATIONS

Office Action issued in Corresponding Japanese Patent App. No. 2021570747 mailed May 21, 2024.
International Search Report and Written Opinion of the ISA issued in PCT/US2020/035041, mailed Sep. 11, 2020; ISA/KR.

* cited by examiner

RF IMMUNE SENSOR PROBE FOR MONITORING A TEMPERATURE OF AN ELECTROSTATIC CHUCK OF A SUBSTRATE PROCESSING SYSTEM

CROSS-REFERENCE TO RELATED APPLICATIONS

The present disclosure is a U.S. National Phase Application under 35 U.S.C. 371 of International Application No. PCT/US2020/035041, filed on May 29, 2020, which claims the benefit of U.S. Patent Application No. 62/854,476 filed on May 30, 2019. The entire disclosures of the applications referenced above are incorporated herein by reference.

FIELD

The present disclosure relates generally to substrate processing systems and more particularly to a sensor probe for monitoring a temperature of an electrostatic chuck in a substrate processing system.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems perform treatments on substrates such as semiconductor wafers. Examples of substrate treatments include deposition, ashing, etching, cleaning and/or other processes. Process gas mixtures may be supplied to the processing chamber to treat the substrate. Plasma may be used to ignite the gases to enhance chemical reactions.

A substrate is arranged on a substrate support in the processing chamber during treatment. Changes in the temperature of the substrate support may affect the treatment. For example, deposition or etch rates may be affected by different temperatures at different locations of the substrate. As a result, deposition or etching may be different in the different locations. Some substrate supports include embedded temperature sensors to sense temperatures in multiple zones. In some examples, each of the zones includes one or more redundant temperature sensors that are used as backups when the temperature sensor for the zone fails. When all of the temperature sensors in one of the zones fail, the substrate support needs to be replaced, which can be expensive.

SUMMARY

A sensor probe includes an elongated body defining an inner cavity having an inner diameter. A printed circuit board is configured to be fitted within the inner cavity. A first temperature-sensing integrated circuit mounted at a first end of the printed circuit board. A cap is mounted to a first end of the elongated body adjacent to the first temperature-sensing integrated circuit. A housing is configured to receive a second end of the elongated body. The housing is configured to be mounted to a baseplate of a substrate support.

In other features, the printed circuit board has a width that is less than the inner diameter and a length that is longer than the elongated body. The inner diameter is less than or equal to 3 mm and at least two of three orthogonal dimensions of the first temperature-sensing integrated circuit are less than 3 mm.

In other features, potting material connects the cap and the first temperature-sensing integrated circuit. The printed circuit board is flexible and is bent at an angle adjacent to the first temperature-sensing integrated circuit. The cap includes first and second legs that extend from one side of the cap and that are received in the inner cavity of the elongated body. The elongated body is reciprocally received in the housing. The elongated body includes a projection and further comprising a spring located around the elongated body and biased between an inner cavity of the housing and the projection.

In other features, the first temperature-sensing integrated circuit senses a temperature of a surface in contact with the cap. The surface is a layer within an electrostatic chuck.

In other features, the elongated body includes a radial projection to center the elongated body in a cavity of the baseplate. The elongated body includes a slot. The slot has an elongated elliptical shape and is aligned in an axial direction of the elongated body.

In other features, a shielding layer is arranged on at least one surface of the printed circuit board. The housing defines an inclined surface. An O-ring is arranged against the inclined surface between the housing and a cavity of the baseplate.

In other features, the printed circuit board is flexible. A connector is connected to a second end of the printed circuit board. A plurality of wires is connected by the connector to traces on the printed circuit board. A second temperature-sensing integrated circuit is mounted on the printed circuit board between the first temperature-sensing integrated circuit and a second end of the printed circuit board.

A sensor probe includes an elongated body defining an inner cavity having an inner diameter. A first printed circuit board is configured to be fitted within the inner cavity. A temperature-sensing integrated circuit mounted on the first printed circuit board. A housing is configured to receive one end of the elongated body and configured to be mounted to a baseplate of a substrate support. Aa second printed circuit board is arranged in the housing. A plurality of first conductors connect the first printed circuit board to the second printed circuit board. A plurality of second conductors configured to connect the second printed circuit board to external devices.

In other features, the first printed circuit board has a width that is less than the inner diameter and a length that is less than a length of the elongated body. The second printed circuit board has a length that is less than a length of the housing. The inner diameter is less than or equal to 3 mm and at least two of three orthogonal dimensions of the temperature-sensing integrated circuit are less than 3 mm.

In other features, potting material is located inside of the elongated body. The first printed circuit board and the temperature-sensing integrated circuit are mounted parallel to a length of the elongated body. The temperature-sensing integrated circuit senses a temperature of a surface in contact therewith. The surface is a layer within an electrostatic chuck. The elongated body includes a radial projection to center the elongated body in a cavity of the baseplate.

In other features, the elongated body includes a slot. The slot has an elongated elliptical shape and is aligned in an axial direction of the elongated body. A capacitor is connected to the first printed circuit board. A resistor is connected to the second printed circuit board. A shielding layer is arranged on a surface of the first printed circuit board.

A sensor probe includes an elongated body defining an inner cavity having an inner diameter. A temperature-sensing integrated circuit is configured to be fitted within the inner cavity. A housing is configured to receive one end of the elongated body and configured to be mounted to a baseplate of a substrate support. A plurality of conductors are configured to pass through the housing and the elongated body and to connect the temperature-sensing integrated circuit to external devices.

In other features, the inner diameter is less than or equal to 3 mm and wherein at least two of three orthogonal dimensions of the temperature-sensing integrated circuit are less than 3 mm. Potting material is located inside of the elongated body. The temperature-sensing integrated circuit is mounted parallel to a length of the elongated body. The temperature-sensing integrated circuit is mounted perpendicular to a length of the elongated body.

In other features, the temperature-sensing integrated circuit senses a temperature of a surface in contact therewith. The surface is a layer within an electrostatic chuck. The elongated body includes a radial projection to center the elongated body in a cavity of the baseplate.

In other features, the elongated body includes a slot. The slot has an elongated elliptical shape and is aligned in an axial direction of the elongated body. A plurality of solder balls is attached to the temperature-sensing integrated circuit. The plurality of first conductors are attached to the plurality of solder balls.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure relates to sensor probes that sense a temperature of a surface in a processing chamber of a substrate. The sensor probe includes a temperature-sensing integrated circuit. In some examples, the temperature-sensing integrated circuit is located within a body that is made of metal and connected to a reference potential such as ground. For example, the body may be grounded to the baseplate. As a result, the body of the sensor probe acts as a Faraday cage and the sensor probe is immune to RF signals such as RF bias signals, electrode signals, etc. that are present in the temperature sensing environment. Alternately, the body may be made of metallic or non-metallic materials and ground planes or electromagnetic shielding can be used to reduce or further reduce electromagnetic interference (EMI).

In some examples, the temperature-sensing integrated circuit has a small form factor that is less than 3 mm in at least two of three orthogonal dimensions. In some examples, the temperature-sensing integrated circuit has a small form factor that is less than 2 mm in all three orthogonal dimensions. In some examples, the body of the sensor probe has an outer diameter that is less than or equal to 4 mm and an inner diameter that is less than or equal to 3 mm.

Figure 1:
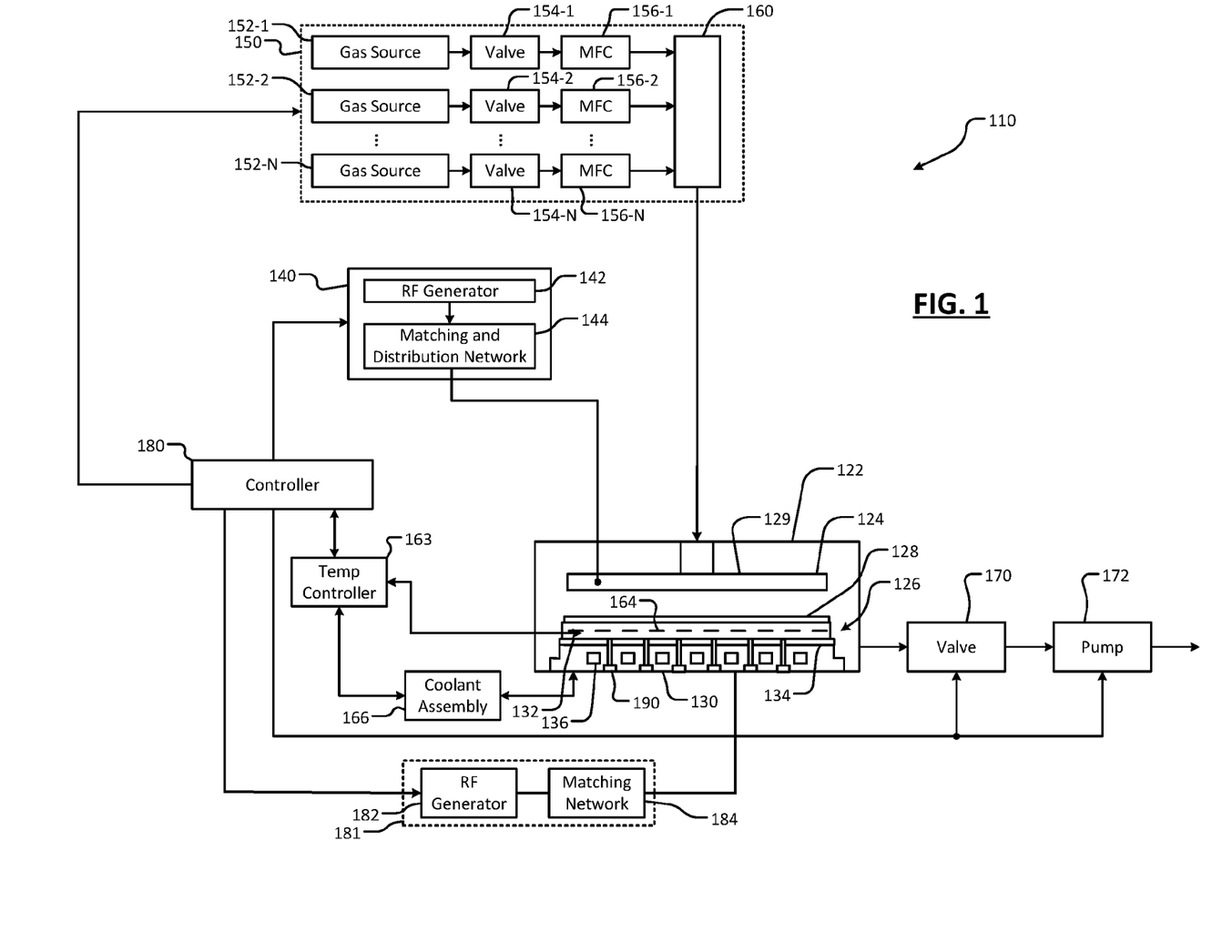
FIG. 1 is a functional block diagram of an example of a capacitively coupled plasma (CCP) substrate processing system including a sensor probe according to the present disclosure.
Figure 2:
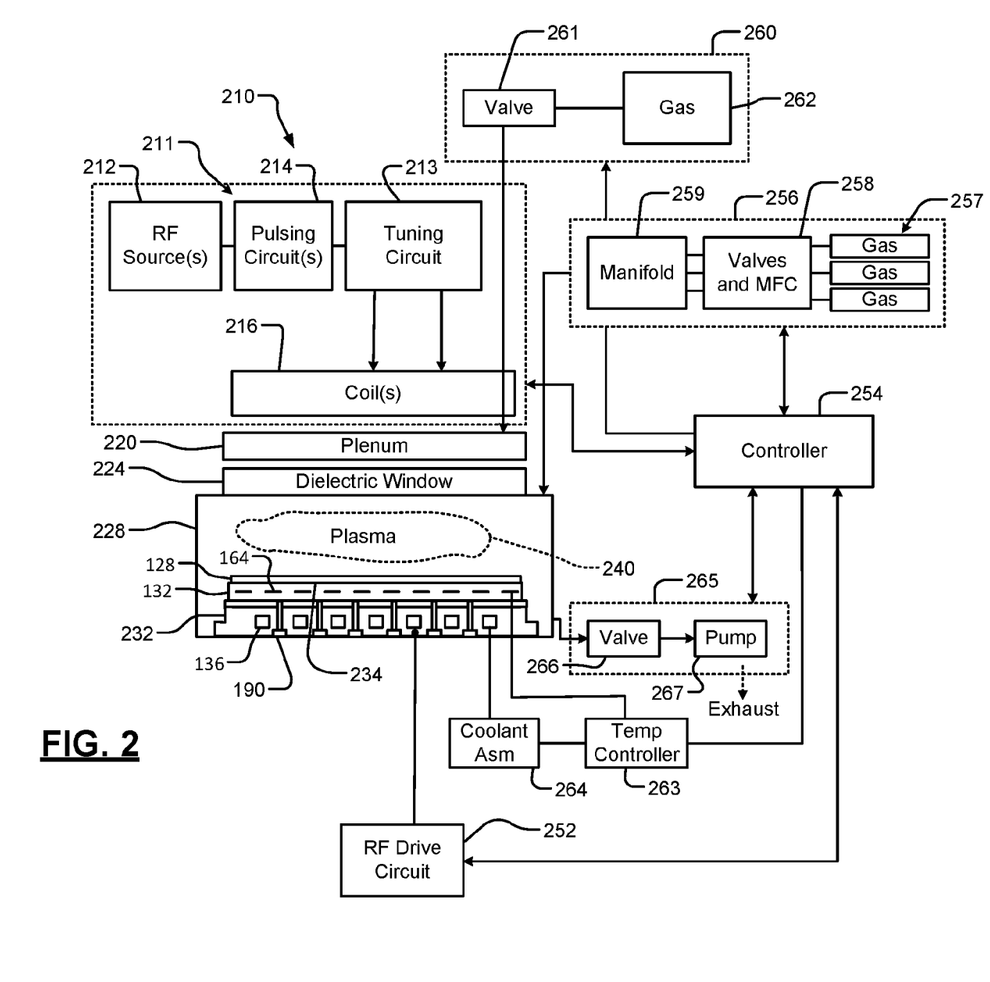
FIG. 2 is a functional block diagram of an example of an inductively coupled plasma (ICP) substrate processing system including a sensor probe according to the present disclosure.

Referring now to FIGS. 1 and 2, examples of plasma processing chambers that may use the sensor probes are shown. As can be appreciated, the sensor probes can be used in a variety of other types of semiconductor processing equipment such as cooled pedestals, spin chucks, processing chambers, etc. In FIG. 1, an example of a substrate processing system 110 according to the present disclosure is shown. The substrate processing system 110 includes a processing chamber 122 that encloses other components of the substrate processing system 110 and contains the RF plasma (if used). The substrate processing system 110 includes an upper electrode 124 and a substrate support 126 such as an electrostatic chuck (ESC). During operation, a substrate 128 is arranged on the substrate support 126.

For example only, the upper electrode 124 may include a gas distribution device 129 such as a showerhead that introduces and distributes process gases. The gas distribution device 129 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which precursor, reactants, etch gases, inert gases, carrier gases, other process gases or purge gas flows. Alternately, the upper electrode 124 may include a conducting plate and the process gases may be introduced in another manner.

The substrate support 126 includes a baseplate 130 that acts as a lower electrode. The baseplate 130 supports a heating plate 132, which may correspond to a ceramic multi-zone heating plate. A thermal resistance layer 134 may be arranged between the heating plate 132 and the baseplate 130. The baseplate 130 may include one or more channels 136 for flowing coolant through the baseplate 130.

An RF generating system 140 generates and outputs an RF voltage to one of the upper electrode 124 and the lower electrode (e.g., the baseplate 130 of the substrate support 126). The other one of the upper electrode 124 and the baseplate 130 may be DC grounded, AC grounded or floating. For example only, the RF generating system 140 may include an RF generator 142 that generates RF plasma power that is fed by a matching and distribution network 144 to the upper electrode 124 or the baseplate 130. In other examples, the plasma may be generated inductively or remotely.

A gas delivery system 150 includes one or more gas sources 152-1, 152-2, . . . , and 152-N (collectively gas sources 152), where N is an integer greater than zero. The gas sources 152 are connected by valves 154-1, 154-2, . . . , and 154-N (collectively valves 154) and MFCs 156-1, 156-2, . . . , and 156-N (collectively MFCs 156) to a manifold 160. Secondary valves may be used between the MFCs 156 and the manifold 160. While a single gas delivery system 150 is shown, two or more gas delivery systems can be used.

A temperature controller 163 may be connected to a plurality of thermal control elements (TCEs) 164 arranged in the heating plate 132. The temperature controller 163 may be used to control the plurality of TCEs 164 to control a temperature of the substrate support 126 and the substrate 128. The temperature controller 163 may communicate with a coolant assembly 166 to control coolant flow through the channels 136. For example, the coolant assembly 166 may include a coolant pump, a reservoir and/or one or more temperature sensors. The temperature controller 163 operates the coolant assembly 166 to selectively flow the coolant through the channels 136 to cool the substrate support 126.

A valve 170 and pump 172 may be used to evacuate reactants from the processing chamber 122. A system controller 180 may be used to control components of the substrate processing system 110. The substrate processing system 210 may include an RF generating system 181 having an RF generator 182 and a matching network 184. The matching network 184 may be connected to the substrate support 126. One or more sensor probes 190 may be inserted into cavities defined in the substrate support to sense a temperature of surface.

In FIG. 2, another example of a substrate processing system 210 is shown. The substrate processing system 210 includes a coil driving circuit 211. A pulsing circuit 214 may be used to pulse the RF power on and off or vary an amplitude or level of the RF power. The tuning circuit 213 may be directly connected to one or more inductive coils 216. The tuning circuit 213 tunes an output of the RF source 212 to a desired frequency and/or a desired phase, matches an impedance of the coils 216 and splits power between the coils 216. In some examples, the coil driving circuit 211 is replaced by one of the drive circuits described further below in conjunction with controlling the RF bias.

In some examples, a plenum 220 may be arranged between the coils 216 and a dielectric window 224 to control the temperature of the dielectric window 224 with hot and/or cold air flow. The dielectric window 224 is arranged along one side of a processing chamber 228. The processing chamber 228 further comprises a substrate support (or pedestal) 232. The substrate support 232 may include an electrostatic chuck (ESC), or a mechanical chuck or other type of chuck. Process gas is supplied to the processing chamber 228 and plasma 240 is generated inside of the processing chamber 228. The plasma 240 etches an exposed surface of the substrate 234. A drive circuit 252 (such as one of those described below) may be used to provide an RF bias to an electrode in the substrate support 232 during operation.

A gas delivery system 256 may be used to supply a process gas mixture to the processing chamber 228. The gas delivery system 256 may include process and inert gas sources 257, a gas metering system 258 such as valves and mass flow controllers, and a manifold 259. A gas delivery system 260 may be used to deliver gas 262 via a valve 261 to the plenum 220. The gas may include cooling gas (air) that is used to cool the coils 216 and the dielectric window 224. A heater/cooler 264 may be used to heat/cool the substrate support 232 to a predetermined temperature. A temperature controller 263 may be included and connected to the controller 254, the substrate support 232, and the coolant assembly 264. An exhaust system 265 includes a valve 266 and pump 267 to remove reactants from the processing chamber 228 by purging or evacuation.

A controller 254 may be used to control the etching process. The controller 254 monitors system parameters and controls delivery of the gas mixture, striking, maintaining and extinguishing the plasma, removal of reactants, supply of cooling gas, and so on. Additionally, as described below in detail, the controller 254 may control various aspects of the coil driving circuit 211 and the drive circuit 252. One or more sensor probes 190 may be inserted into cavities of the substrate support to sense a temperature a surface.

Figure 3:
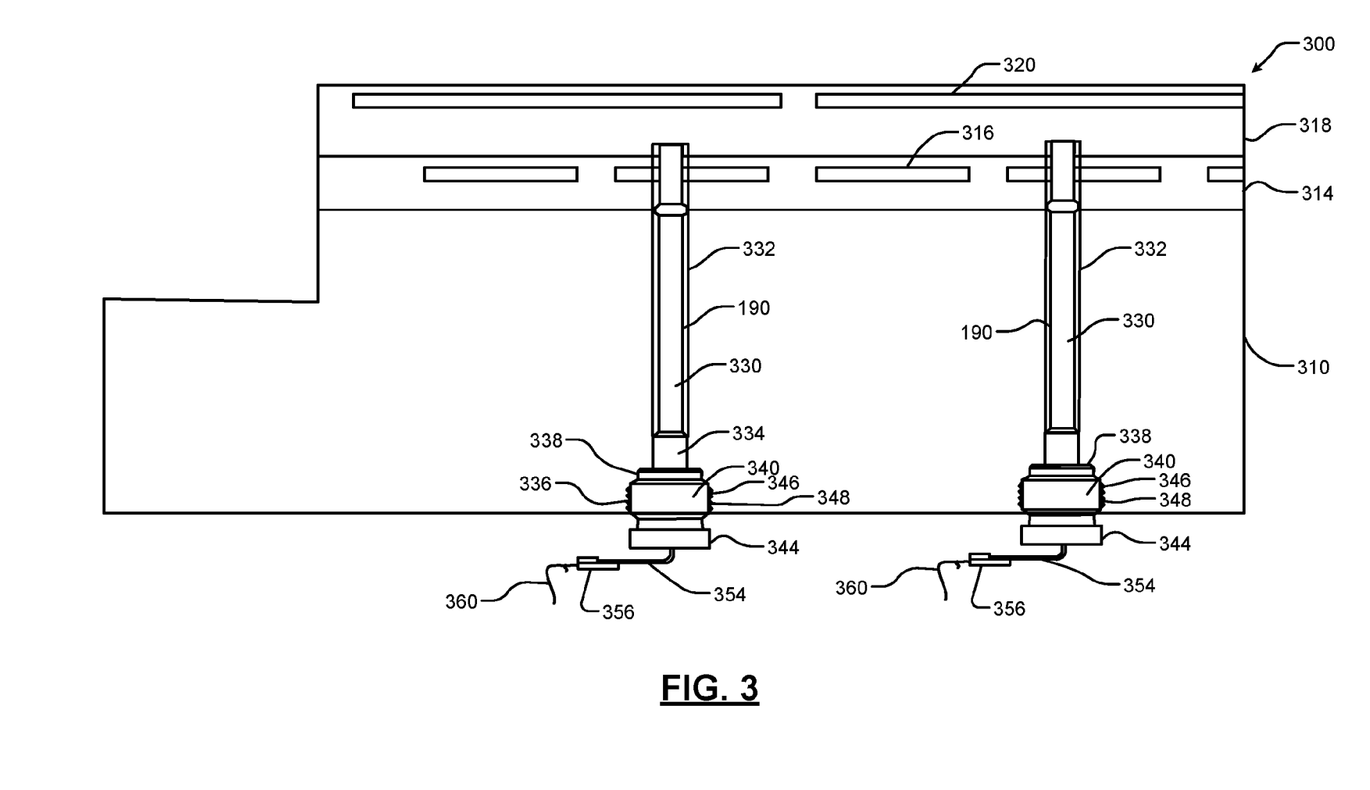
FIG. 3 is a side cross-sectional view of an example of a substrate support including a sensor probe according to the present disclosure.
Figures 4A, 4B:
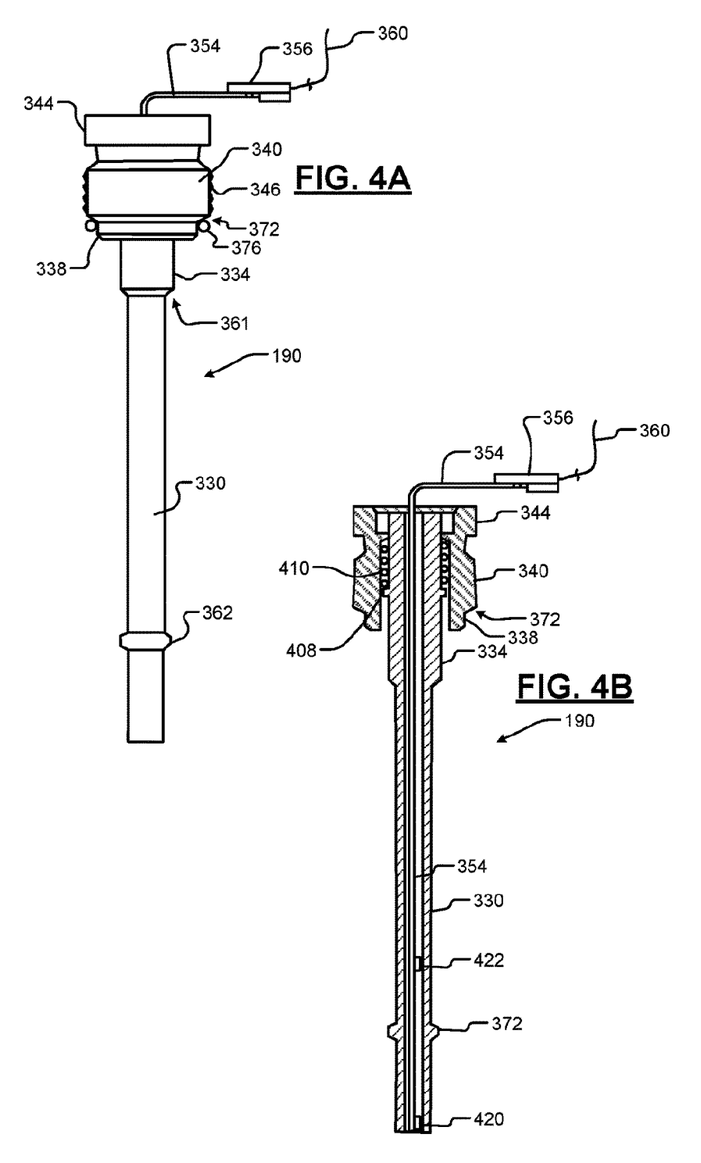
FIG. 4A is a side view of an example of a sensor probe according to the present disclosure.
FIG. 4B is a side cross-sectional view of an example of a sensor probe according to the present disclosure.

Referring now to FIGS. 3, 4A and 4B, a substrate support 300 such as an electrostatic chuck (ESC) includes a baseplate 310 arranged adjacent to a heater layer 314. While a baseplate of a substrate support is shown, the sensor probe can be used to sense the temperature of a surface of other components of substrate processing equipment. The heater layer 314 includes heaters 316. A ceramic layer 318 including electrodes 320 is arranged adjacent to the heater layer 314. A sensor probe 190 is inserted into cylindrical cavity 332.

In some examples, the sensor probe 190 includes an elongated body 330 including a first end portion 334. The first end portion 334 of the sensor probe 190 has a diameter that is greater than a diameter of an elongated body 330. The elongated body 330 is received by a threaded housing 336 located at one end of the elongated body 330.

The threaded housing 336 includes a first portion 338, a second portion 340 and a third portion 344. In some examples, the first portion 338, the second portion 340 and the third portion 344 are cylindrical and include aligned internal cavities. The second portion 340 has a diameter that is greater than a diameter of the first portion 338. The second portion 340 includes threads 346 that are received in threaded bores 348 in the baseplate 310 of the substrate support 300. The third portion 344 projects radially outwardly from the baseplate 310 to allow the sensor probe 190 to be rotated relative to the baseplate 310 to allow insertion and removal.

A printed circuit board (PCB) 354 such as a flexible PCB passes through the elongated body 330 and extends from the third portion 344 of the threaded housing 336. The PCB 354 is connected by a connector 356 (such as a PCB) to one or more wires 360 supplying power, ground and one or more signal lines to and from an integrated circuit located in the sensor probe 190.

In FIG. 4A, the elongated body 330 of the sensor probe 190 includes an inclined surface 361 which provides a transition from the diameter of the elongated body 330 to the larger diameter of the first end portion 334. A spacer 362 projects from the elongated body 330 in a radial direction to evenly space the elongated body 330 within the cylindrical cavity 332. An inclined surface 372 provides a transition from the first portion 338 to the second portion 340 of the threaded housing 336. In some examples, an O-ring 376 is arranged against the inclined surface 372 and acts as an RF gasket.

In FIG. 4B, the elongated body 330 includes a radially-projecting surface 408 located along the first end portion 334. The sensor probe 190 includes a spring 410 located around the first end portion 334 adjacent to an inner surface of a cavity formed in the threaded housing 336. The spring 410 biases an end of the elongated body 330 against a surface to determine a temperature of the surface.

A first integrated circuit 420 is mounted on the PCB 354. The first integrated circuit 420 senses a first temperature of the surface to be monitored. In some examples, a second integrated circuit 422 is mounted on the PCB 354. The second integrated circuit 422 senses a temperature that is remote from the surface to be monitored and is used to increase the reliability of the temperature measured by the first integrated circuit 420, for diagnostic monitoring and/or for rationality checks of the first integrated circuit 420.

Figure 5:
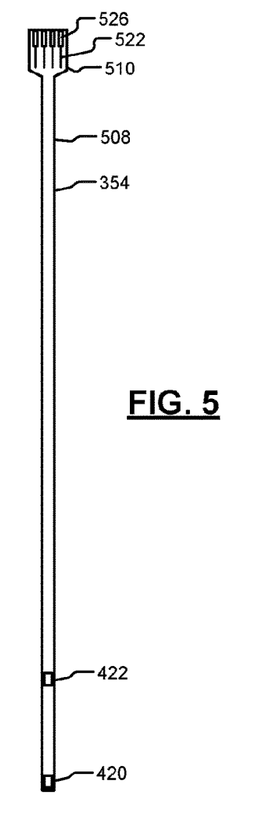
FIG. 5 is a plan view of an example of a printed circuit board according to the present disclosure.

In FIG. 5, the PCB 354 is shown to include a first portion 508 that extends a distance greater than the elongated body 330 of the sensor probe 190. The first integrated circuit 420 is mounted at one end of the first portion 508. If used, the second integrated circuit 422 is mounted at a location spaced from the first integrated circuit 420. A second end 510 of the PCB 354 includes terminals 526 connected to traces 522 (partially shown). The PCB 354 includes two or more layers including conductive traces, vias, ground planes, etc. to provide connections from the terminals 526 to the first integrated circuit 420 and/or the second integrated circuit 422.

Figure 6:
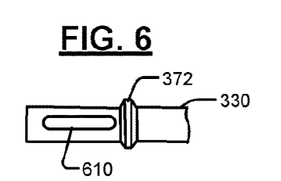
FIG. 6 is an enlarged, partial side view of an example of a body of the sensor probe according to the present disclosure.

Referring now to FIG. 6, the elongated body 330 may include one or more slots 610 to allow heat transfer. In some examples, the slots 610 have an elongated elliptical shape and are aligned in an axial direction of the elongated body 330.

Figure 7:
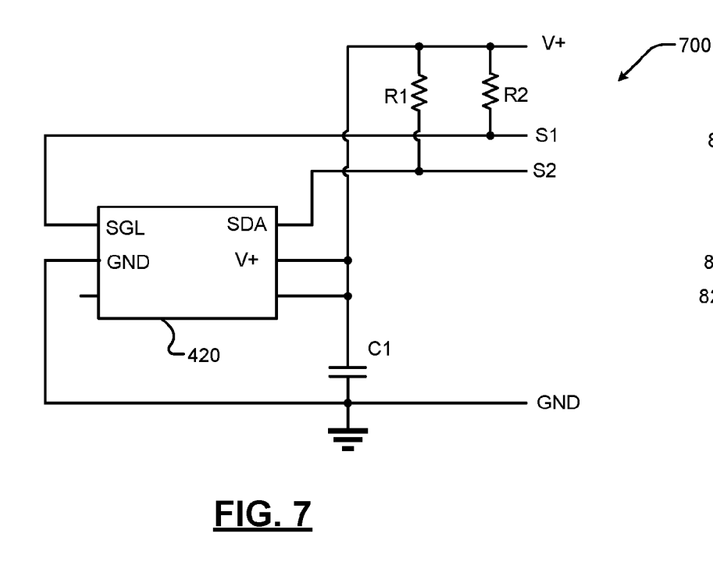
FIG. 7 is an electrical schematic and functional block diagram of an example of a control circuit including a temperature-sensing integrated circuit, resistors and a capacitor according to the present disclosure.

Referring now to FIG. 7, a circuit 700 including the first integrated circuit 420, resistors R1 and R2 and a capacitor C1 is shown. A voltage supply line $V^+$ is connected to a $V^+$ terminal of the first integrated circuit 420. A first reference potential such as ground is connected to a GND input and a second input of the first integrated circuit 420. Signal lines S1 and S2 are connected to SDA and SGL lines of the first integrated circuit 420. Resistors R1 and R2 are connected between the voltage supply line $V^+$ and the signal lines S1 and S2.

Figure 8:
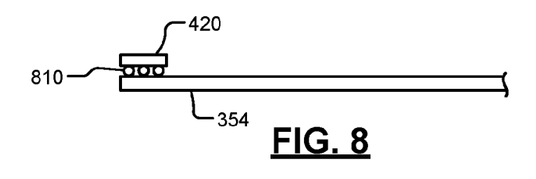
FIG. 8 is a side view illustrating attachment of an example of the temperature-sensing integrated circuit to the printed circuit board according to the present disclosure.

Referring now to FIG. 8, attachment of the first integrated circuit 420 to the PCB 354 is shown. Solder bumps 810 connect pads on the first integrated circuit 420 to corresponding pads on the PCB 354.

Figure 9A:
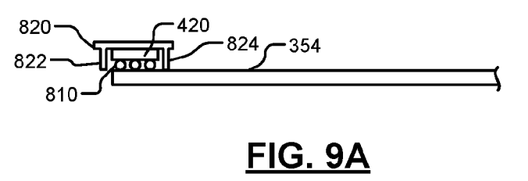
FIGS. 9A and 9B are side views illustrating an example of attachment of the temperature-sensing integrated circuit and the printed circuit board to a metal cap according to the present disclosure.
Figure 9B:
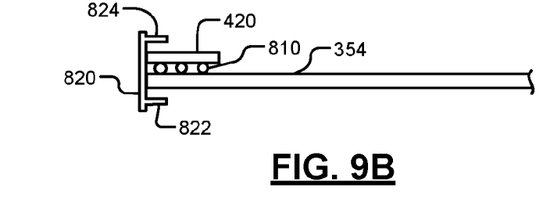

Referring now to FIGS. 9A and 9B, attachment of the first integrated circuit 420 and the PCB 354 to a cap 820 is shown. In some examples, the cap 820 is made of metal and includes legs 822 and 824 extending from one side thereof. In FIG. 9A, the cap 820 is arranged or attached with the legs 822 and 824 extending transverse to a mounting surface of the PCB 354. In FIG. 9B, the cap 820 is arranged or attached with the legs 822 and 824 extending parallel to the mounting surface of the PCB 354.

Figure 10A:
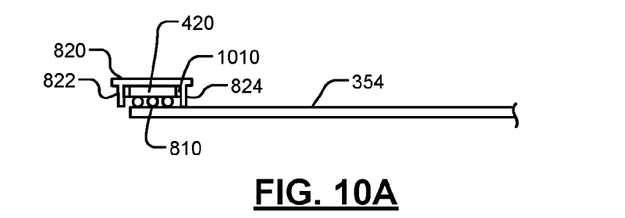
FIGS. 10A and 10B are side views illustrating an example of potting of the temperature-sensing integrated circuit to the cap according to the present disclosure.
Figure 10B:
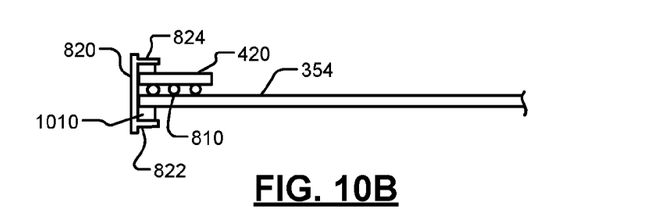

Referring now to FIGS. 10A and 10B, potting of the first integrated circuit 420 to the cap 820 is shown. Potting material 1010 is applied to attach the cap 820 to the integrated circuit.

Figure 11A:
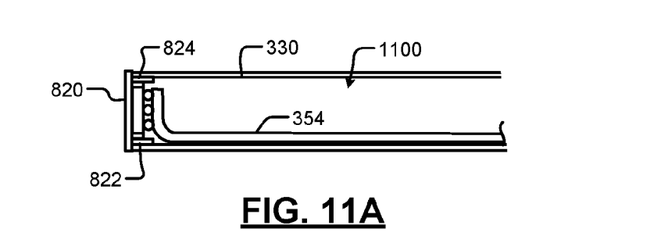
FIGS. 11A and 11B are side views illustrating an example of insertion of the printed circuit board, the temperature-sensing integrated circuit, and the cap into the body of the sensor probe according to the present disclosure.
Figure 11B:
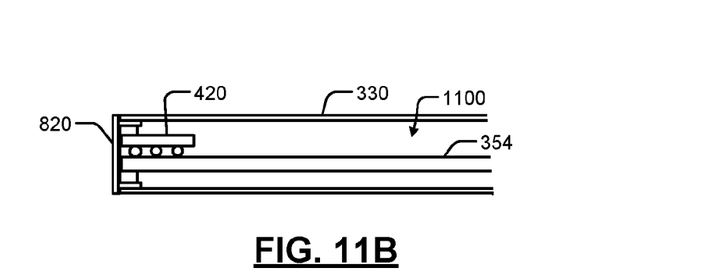

Referring now to FIGS. 11A and 11B, the PCB 354, the first integrated circuit 420, and the cap 820 are inserted into a cavity 1100 of the elongated body 330. In FIG. 11B, the PCB 354 is bent at a right angle to allow the legs 822 and 824 of the cap 820 to be inserted into an end of the elongated body 330.

Figure 12:
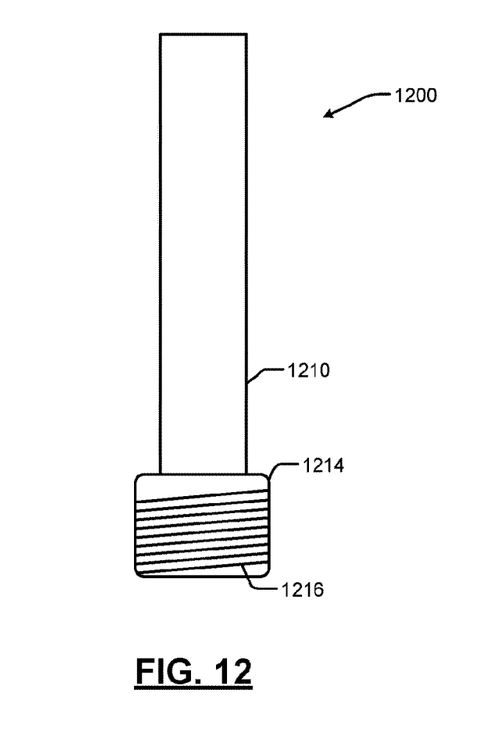
FIG. 12 is a side view illustrating another example of the sensor probe according to the present disclosure.
Figure 13:
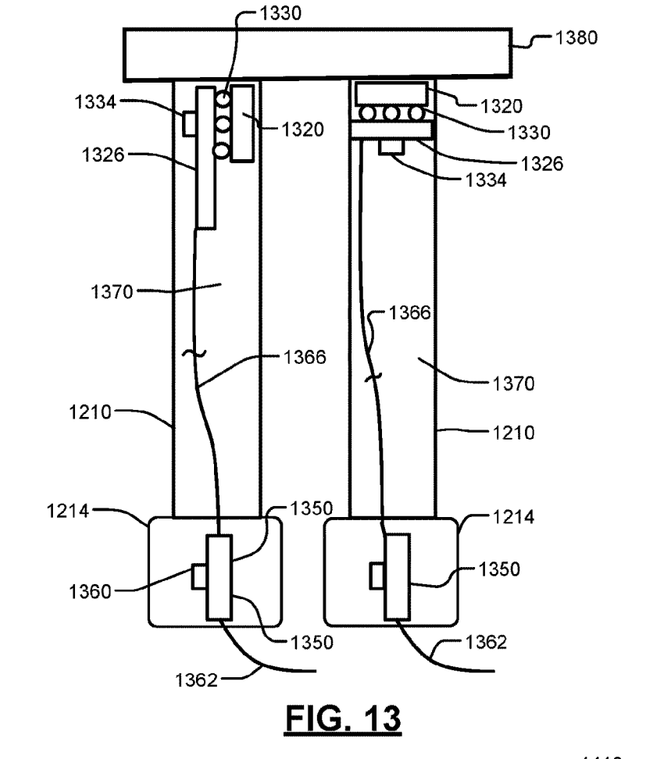
FIG. 13 is a side cross-sectional view illustrating another example of the sensor probe according to the present disclosure.

Referring now to FIGS. 12 and 13, another example of the sensor probe 1200 is shown. In FIG. 12, the sensor probe 1200 includes an elongated body 1210 connected to a threaded housing 1214. In some examples, the threaded housing 1214 includes a threaded surface 1216.

In FIG. 13, a first integrated circuit 1320 is mounted by solder balls 1330 to a first PCB 1326. A capacitor 1334 is mounted on the first PCB 1326. A second PCB 1350 is arranged in the threaded housing 1214 and includes a resistor 1360 mounted thereto. One or more wires 1362 provide external connections. One or more wires or hard PCB traces 1366 provide connections between the first PCB 1326 and the second PCB 1350. Potting material 1370 is located inside of the elongated body 1210. The first integrated circuit 1320 senses a temperature of a surface 1380.

Figure 14:
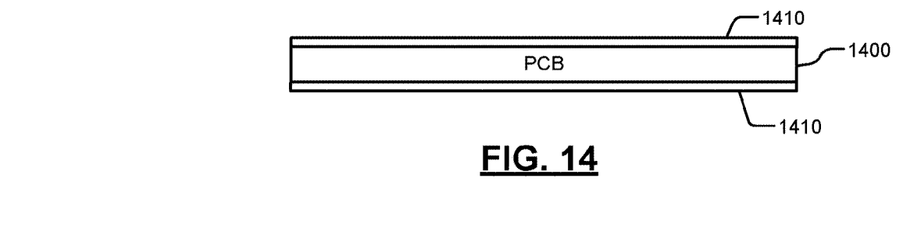
FIG. 14 is a side cross-sectional view of a PCB with metal layers for EMI shielding according to the present disclosure.

Referring now to FIG. 14, if additional shielding is desired, shielding layers 1410 can be used to cover upper and/or lower surfaces of a PCB 1400 to provide enhanced shielding. In some examples, the shielding layers 1410 include a metal layer. In some examples, the shielding layers 1410 are connected to a reference potential such as ground. In other examples, the shielding layer 1410 includes a plurality of conductors. In some examples, the plurality of conductors are uniformly spaced and form a grid in one or more transverse directions. The plurality of conductors are connected to a reference potential such as ground.

Figure 15:
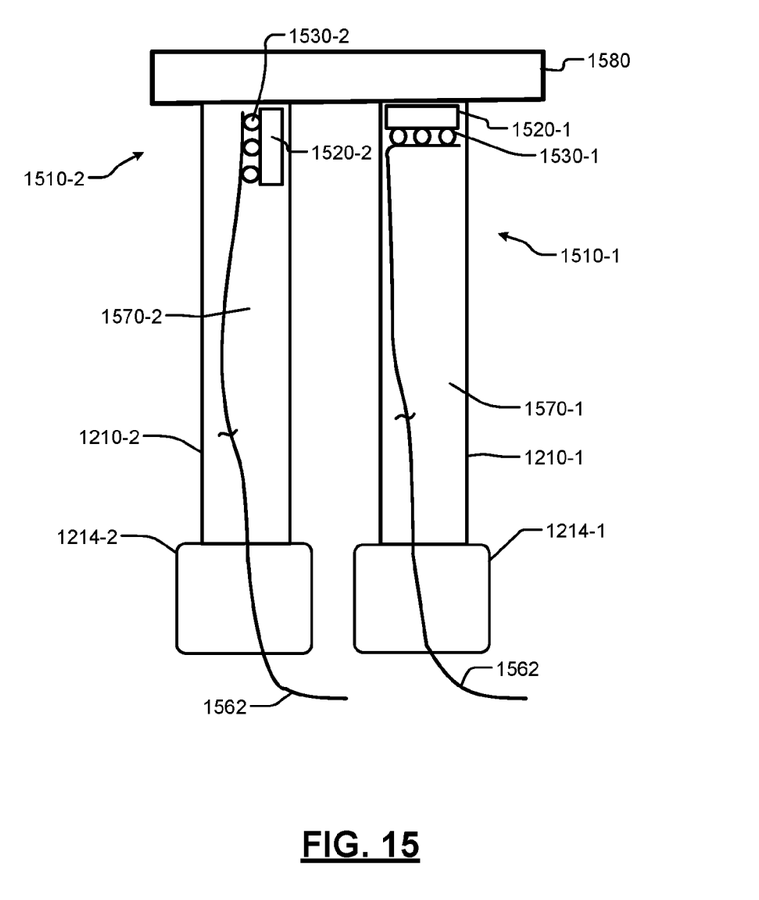
FIG. 15 is a side cross-sectional view illustrating another example of the sensor probe according to the present disclosure.

Referring now to FIG. 15, the sensor probes can also be implemented without using printed circuit boards. While two sensor probes are shown to show variations in the position of the temperature-sensing integrated circuit, one or more than two sensor probes can be used in a given application. First and second sensor probes 1510-1 and 1510-2 include integrated circuits 1520-1 and 1520-2 that are located in the elongated bodies 1210-1 and 1210-2, respectively, adjacent to a surface-facing end of the elongated bodies 1210-1 and 1210-2, respectively. A plurality of solder balls 1530-1 and 1530-2 provide connections to the integrated circuits 1520-1 and 1520-2, respectively. A plurality of wires 1562 are soldered to selected ones of the plurality of solder balls 1530-1 and 1530-2 to provide one or more external connections to the integrated circuits 1520-1 and 1520-2 through the threaded housings 1214-1 and 1214-2 and the elongated bodies 1210-1 and 1210-2, respectively. In some examples, the wires 1562 include insulated conductors.

Potting material 1570-1 and 1570-2 is located inside of the elongated bodies 1210-1 and 1210-2, respectively. The integrated circuits 1520-1 and 1520-2 sense a temperature of a surface 1580. The integrated circuits 1520-1 and 1520-2 can be arranged parallel to the elongated bodies 1210-1 and 1210-2, perpendicular to the elongated bodies 1210-1 and 1210-2, or at angles therebetween.

In some examples, the number of solder balls S is equal to the number of wires W, where S and W are integers greater than one. In other examples, S>W or W>S.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A sensor probe, comprising:
   an elongated body defining an inner cavity having an inner diameter;
   a printed circuit board configured to be fitted within the inner cavity;
   a first temperature-sensing integrated circuit mounted at a first end of the printed circuit board;
   a cap mounted to a first end of the elongated body adjacent to the first temperature-sensing integrated circuit; and
   a housing configured to receive a second end of the elongated body, wherein the housing is configured to be mounted to a baseplate of a substrate support.

2. The sensor probe of claim 1, wherein the printed circuit board has a width that is less than the inner diameter and a length that is longer than the elongated body.

3. The sensor probe of claim 1, wherein the inner diameter is less than or equal to 3 mm and wherein at least two of three orthogonal dimensions of the first temperature-sensing integrated circuit are less than 3 mm.

4. The sensor probe of claim 1, further comprising potting material connecting the cap and the first temperature-sensing integrated circuit.

5. The sensor probe of claim 1, wherein the printed circuit board is flexible and is bent at an angle adjacent to the first temperature-sensing integrated circuit.

6. The sensor probe of claim 1, wherein the cap includes first and second legs that extend from one side of the cap and that are received in the inner cavity of the elongated body.

7. The sensor probe of claim 1, wherein the elongated body is reciprocally received in the housing.

8. The sensor probe of claim 1, wherein the elongated body includes a projection and further comprising a spring located around the elongated body and biased between an inner cavity of the housing and the projection.

9. The sensor probe of claim 1, wherein the elongated body includes a radial projection to center the elongated body in a cavity of the baseplate.

10. The sensor probe of claim 1, further comprising a shielding layer arranged on at least one surface of the printed circuit board.

11. The sensor probe of claim 1 wherein the housing defines an inclined surface and further comprising an O-ring arranged against the inclined surface between the housing and a cavity of the baseplate.

12. The sensor probe of claim 1, further comprising a second temperature-sensing integrated circuit mounted on the printed circuit board between the first temperature-sensing integrated circuit and a second end of the printed circuit board.

13. The sensor probe of claim 1, wherein:
   the printed circuit board is disposed within the inner cavity and extends to the first end of the elongated body; and
   the first temperature-sensing integrated circuit is mounted at the first end of the printed circuit board and disposed within and at the first end of the elongated body.

14. The sensor probe of claim 1, wherein the first temperature-sensing integrated circuit comprises solder balls, which are attached to the printed circuit board.

15. The sensor probe of claim 1, wherein:
   the first temperature-sensing integrated circuit measures a temperature of the baseplate; and
   the housing is configured to be mounted to a bottom of the baseplate and extend at least partially into the baseplate.

16. The sensor probe of claim 1, wherein the housing screws into the baseplate.

17. The sensor probe of claim 1, wherein the housing and the elongated body are configured to be mounted at least partially within the baseplate of the substrate support.

18. The sensor probe of claim 1, wherein the first temperature-sensing integrated circuit senses a temperature of a surface in contact with the cap.

19. The sensor probe of claim 18, wherein the surface is a layer within an electrostatic chuck.

20. The sensor probe of claim 1, wherein the elongated body includes a slot.

21. The sensor probe of claim 20, wherein the slot has an elongated elliptical shape and is aligned in an axial direction of the elongated body.

22. The sensor probe of claim 1, wherein the printed circuit board is flexible.

23. The sensor probe of claim 22, further comprising:
   a connector connected to a second end of the printed circuit board; and
   a plurality of wires connected by the connector to traces on the printed circuit board.

* * * * *